(12) United States Patent
Lu et al.

(10) Patent No.: US 7,261,916 B1
(45) Date of Patent: Aug. 28, 2007

(54) METHOD OF MANUFACTURING THIN-FILM ANTENNA

(75) Inventors: Kun-Ta Lu, Taoyuan (TW);
Hsin-Chun Lu, Taoyuan (TW);
Han-Lun Lin, Taoyuan (TW)

(73) Assignee: Air Wave Co., Ltd., Taoyuan (TW)

( * ) Notice: Subject to any disclaimer, the term of this patent is extended or adjusted under 35 U.S.C. 154(b) by 22 days.

(21) Appl. No.: 11/366,117

(22) Filed: Mar. 2, 2006

(51) Int. Cl.
*H05K 3/02* (2006.01)
*H05K 3/06* (2006.01)
*H05K 3/10* (2006.01)
*H05K 3/12* (2006.01)
*H05K 3/14* (2006.01)
*B05D 1/38* (2006.01)
*B05D 3/02* (2006.01)
*B05D 3/06* (2006.01)
*B05D 3/10* (2006.01)
*H05K 3/16* (2006.01)

(52) U.S. Cl. .................. 427/97.4; 427/558; 427/97.5; 427/96.8; 427/337; 427/384; 427/427.4

(58) Field of Classification Search ............... None
See application file for complete search history.

(56) References Cited

U.S. PATENT DOCUMENTS 5,362,513 A * 11/1994 Shimada et al. ........... 427/97.5

* cited by examiner

*Primary Examiner*—William Phillip Fletcher, III
(74) *Attorney, Agent, or Firm*—Apex Juris, pllc; Tracy M. Heims

(57) ABSTRACT

A method of manufacturing a thin-film antenna is disclosed. A substrate is provided and coated with an organic material layer. After both of the substrate and organic material layer have been dried, a conductive layer is formed on both the substrate and the organic material layer. The organic material layer and the layer thereon are then removed so that the remaining conductive layer forms a thin-film antenna.

24 Claims, 2 Drawing Sheets

FIG.2A
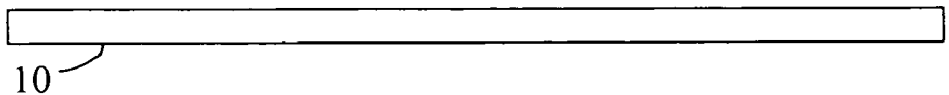
FIG.2B
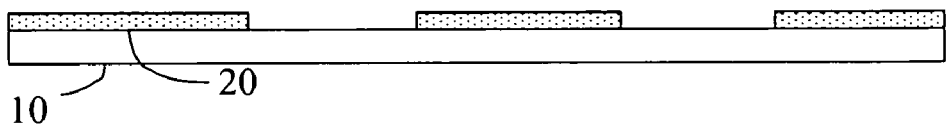
FIG.2C
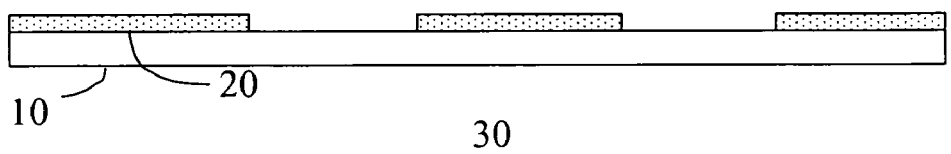
FIG.2D
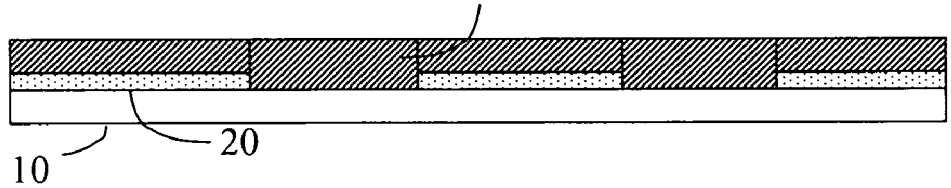
FIG.2E
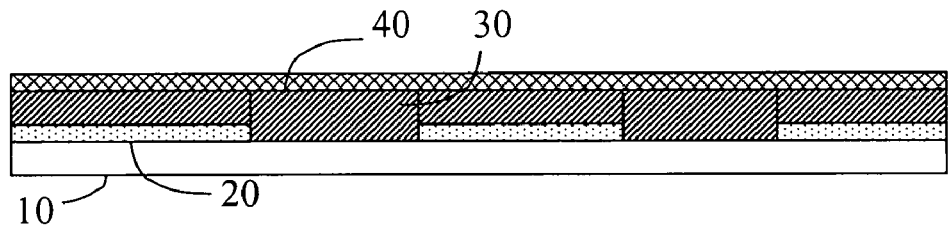
FIG.2F
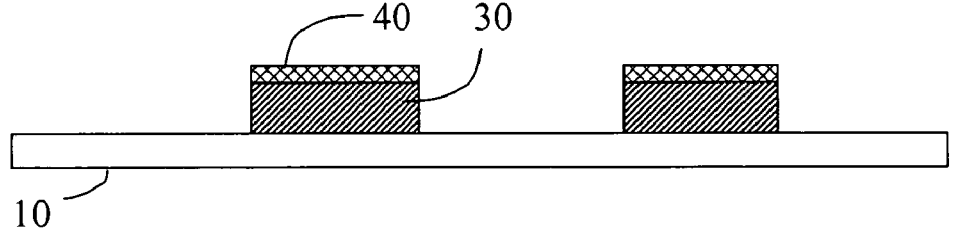
FIG.2G
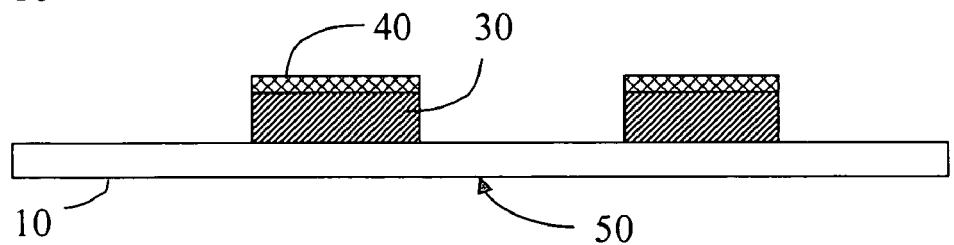
FIG.2

METHOD OF MANUFACTURING THIN-FILM ANTENNA

BACKGROUND OF THE INVENTION

1. Field of Invention

The present invention relates to a method of manufacturing antenna, and more particularly, to a method of manufacturing thin-film antenna.

2. Description of Related Art

An antenna is an electronic component designed to transmit or receive radio waves. Prior types of antennas include wired antenna, etched antenna, and printed antenna. The wired antenna, which is a metallic or conductive wire looped around a core to form a coil, is normally used for low-frequency electromagnetic wave transmission. Etched antenna is manufactured by using acid solution to etch metallic material such as copper or aluminum so that the etched metallic material forms the patterned antenna. The manufacture cost and the use of acid solution, however, are the main concerns that need to be considered. As the printing technique has been improving, a substrate may be printed with conductive material on its surface to form a printed antenna. Precise positioning of the conductive material on the substrate during printing is most important but yet still difficult to achieve satisfactorily.

SUMMARY OF THE INVENTION

An object of the invention is to provide an applicable, cost-effective, and environmental friendly thin-film antenna.

Another object of the invention is to provide a thin-film antenna widely incorporated in wireless communication devices.

To achieve the above objects, the invention provides a method of manufacturing thin-film antenna comprising the steps of: providing a substrate, patterning an organic material layer on the substrate, drying the substrate and the organic material layer, forming a conductive layer on both the substrate and the organic material layer, and removing the organic material layer and the conductive layer thereon.

To achieve the above objects, the invention provides another method of manufacturing a thin-film antenna, comprising the steps of: providing a substrate, patterning an organic material layer on the substrate, drying the substrate and the organic material layer, forming a conductive layer on both the substrate and the organic material layer, forming a protective layer on the conductive layer, and removing the organic material layer and the layers thereon.

BRIEF DESCRIPTION OF THE DRAWINGS

FIG. 2A is a diagrammatic cross-sectional view of a substrate of the second embodiment.

FIG. 2B is a diagrammatic cross-sectional view of an organic material layer coated on the substrate according to the second embodiment.

FIG. 2C is a diagrammatic cross-sectional view of the substrate and the organic material layer being dried by the ultraviolet radiation according to the second embodiment.

FIG. 2D is a diagrammatic cross-sectional view of a conductive layer formed on the organic material layer and the substrate according to the second embodiment.

FIG. 2E is a diagrammatic cross-sectional view of a protective layer coated on the conductive layer according to the second embodiment.

FIG. 2F is a diagrammatic cross-sectional view of the protective layer and the conductive layer after removing the organic material layer and the layers thereon according to the second embodiment.

FIG. 2G is a diagrammatic cross-sectional view of a thin-film antenna of the second embodiment.

DETAILED DESCRIPTION

Figure 1:
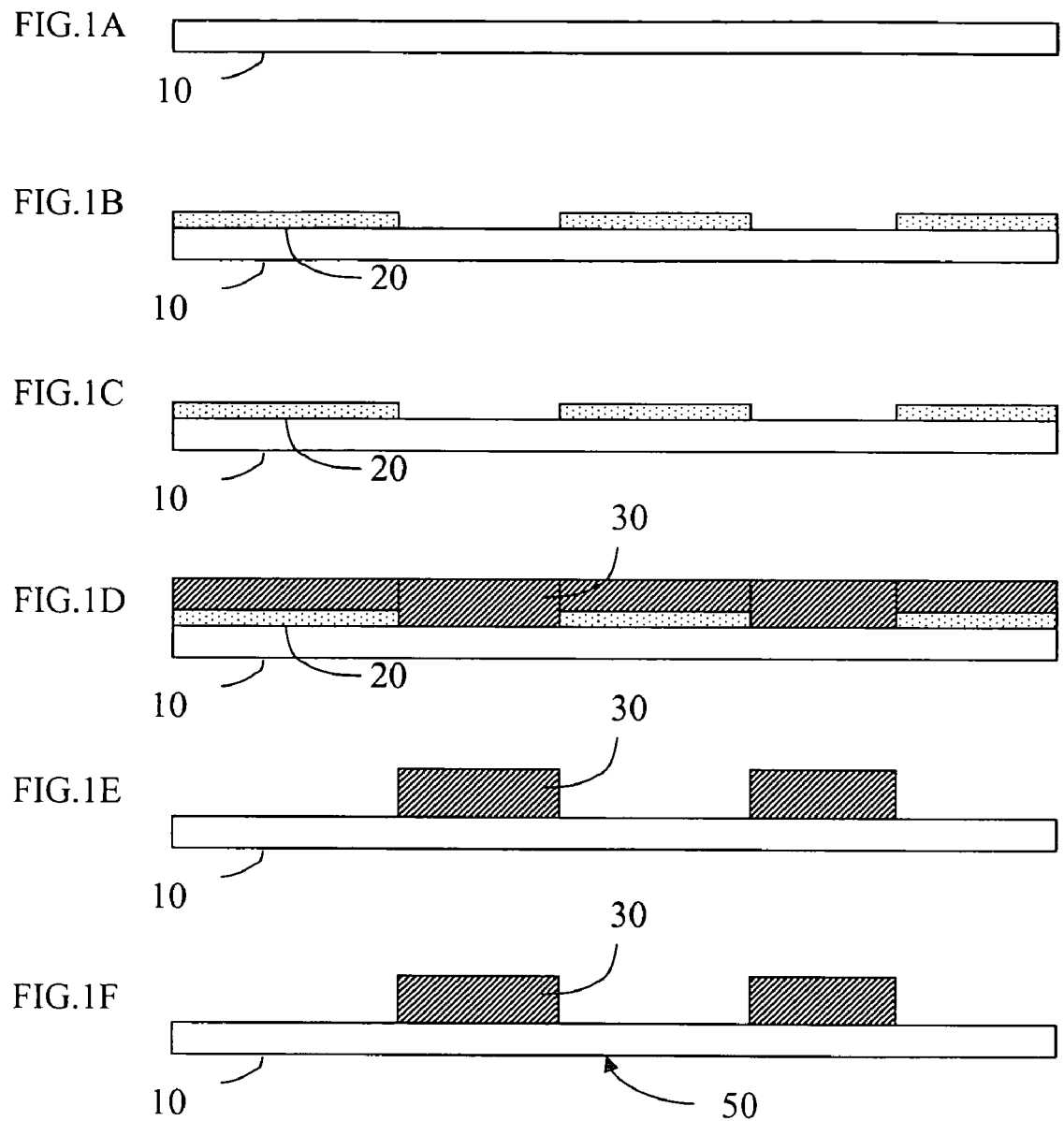
FIG. 1A is a diagrammatic cross sectional view of a substrate of the first embodiment.
FIG. 1B is a diagrammatic cross-sectional view of an organic material layer coated on the substrate according to the first embodiment.
FIG. 1C is a diagrammatic cross-sectional view of the substrate and the organic material layer being dried by ultraviolet radiation according to the first embodiment.
FIG. 1D is a diagrammatic cross-sectional view of a conductive layer formed on the organic material layer and the substrate according to the first embodiment.
FIG. 1E is a diagrammatic cross-sectional view of the conductive layer after the organic material layer and the conductive layer thereon have been removed according to the first embodiment.
FIG. 1F is a diagrammatic cross-sectional view of a thin-film antenna of the first embodiment.

Referring to FIGS. 1A–1F, a thin-film antenna of the first embodiment is disclosed.

Referring to FIG. 1A, a substrate 10 is provided. The materials of the substrate may include polyimide, polyethylene terephthalate (PET), polycarbonate (PC), polymethyl methacrylate (PMMA), glass, acrylic resin or other materials with similar properties.

Referring to FIG. 1B, by screen printing technique, the substrate 10 is coated with a patterned organic material layer 20 on its surface. The organic materials may include heat-dry ink, water soluble resin, water soluble lactoprene, water soluble polyvinyl alcohol (PVA) or other materials having similar organic properties. In one embodiment, the formation of the organic material layer 20 may also include spray coating technique, in which the organic material layer 20 is sprayed on the substrate 10.

Referring to FIG. 1C, the ultraviolet (UV) radiation is used to dry both the surfaces of substrate 10 and organic material layer 20. In one embodiment, they may be heated for drying of the surfaces.

Referring to FIG. 1D, with sputtering technique, a conductive layer 30 is deposited on both the substrate 10 and the organic material layer 20. The conductive layer 30 may have the thickness in the range between 2000–5000 Å. In the preferred embodiment, the conductive layer may have the thickness of 3000 Å. The conductive layer is a metallic material such as copper (Cu), nickel copper (NiCu) alloy or silver (Ag). In addition to the sputtering technique, the conductive layer may be formed by evaporation coating technique.

Referring to FIGS. 1E–1F, both the organic material layer 20 and the conductive layer 30 thereon are removed by water so that the remaining conductive layer forms a thin-film antenna 50. In one embodiment, acid solution may be used for removal purpose.

Referring to FIGS. 2A–2F, a thin-film antenna of the second embodiment is disclosed.

Referring to FIG. 2A, a substrate 10 is provided. The materials of the substrate may include polyimide, polyethylene terephthalate (PET), polycarbonate (PC), polymethyl methacrylate (PMMA), glass, acrylic resin or other materials with similar properties.

Referring to FIG. 2B, by screen printing technique, the substrate 10 is coated with a patterned organic material layer 20 on its surface The organic materials may include heat-dry ink, water soluble resin, water soluble lactoprene, water soluble polyvinyl alcohol (PVA) or other materials having similar organic properties. In one embodiment, the formation of the organic material layer 20 may also include spray coating technique, in which the organic material layer 20 is sprayed on the substrate 10.

Referring to FIG. 2C, the ultraviolet (UV) radiation is used to dry both the surfaces of substrate 10 and organic material layer 20. In one embodiment, they may be heated for drying of the surfaces.

Referring to FIG. 2D, with sputtering technique, a conductive layer 30 is deposited on both the substrate 10 and the organic material layer 20. The conductive layer 30 may have the thickness in the range between 2000–5000 Å. In the preferred embodiment, the conductive layer may have the thickness of 3000 Å. The conductive layer is a metallic material such as copper (Cu), nickel copper (NiCu) alloy or silver (Ag). In addition to the sputtering technique, the conductive layer may be formed by evaporation coating technique.

Referring to FIG. 2E, an anti-oxidation material is coated on the conductive layer 30 to form a protective layer 40. Metallic material, for example nickel, with the technique such as evaporation coating or sputtering may be used to form the protective layer.

Referring to FIGS. 2F–2G, the organic material layer 20 and the layers 30,40 thereon are removed by water so that the remaining portion of the layer 30,40 forms a thin-film antenna 50. In one embodiment, acid solution may be used for removal purpose.

The method of manufacturing a thin-film antenna of the invention comprises providing a substrate, patterning an organic material layer on the substrate, drying the organic material layer and the substrate, forming a conductive layer on both the substrate and the organic material layer, and removing the organic material layer and the conductive layer thereon, thereby the thin-film antenna is formed. The thin-film antenna of the invention is applicable and cost-effective. Using water to remove undesirable layers is environmental friendly.

The thin-film antenna of the invention may incorporate in wireless communication devices such as cellular phone, wireless access point (AP), wireless router, wireless gateway, radio frequency identification (RFID) devices, and laptop computer for transmitting and receiving radio waves.

Although the invention has been described in terms of exemplary embodiments, it is not limited thereto. Rather, the appended claims should be considered broadly, to include other variants and embodiments of the invention, which may be made by those skilled in the art without departing from the scope and range of equivalents of the invention.

What is claimed is:

1. A method of manufacturing a film antenna, comprising the steps of:
   providing a substrate;
   patterning an organic material layer on said substrate;
   drying said substrate and said organic material layer;
   forming a conductive layer on said substrate and said organic material layer; and
   removing said organic material layer and said layer thereon.

2. The method as claimed in claim 1, wherein said substrate is the material selected from the group consisting of polyimide, polyethylene terephthalate, polycarbonate, polymethyl methacrylate, glass, and acrylic resin.

3. The method as claimed in claim 1, wherein said organic material layer is patterned by a screen printing technique.

4. The method as claimed in claim 1, wherein said organic material layer is patterned by a spray coating technique.

5. The method as claimed in claim 1, wherein said organic material layer is the material selected from the group consisting of heat-dry ink, water soluble resin, water soluble lactoprene, and water soluble polyvinyl alcohol.

6. The method as claimed in claim 1, wherein said substrate and said organic material layer are dried by heating.

7. The method as claimed in claim 1, wherein said substrate and said organic material layer are dried by ultraviolet radiation.

8. The method as claimed in claim 1, wherein said conductive layer is formed by an evaporation coating technique.

9. The method as claimed in claim 1, wherein said conductive layer is formed by a sputtering technique.

10. The method as claimed in claim 1, wherein said conductive layer is the material selected from the group consisting of copper, nickel copper alloy, and silver.

11. The method as claimed in claim 1, wherein said conductive layer has a thickness in the range between 2000–5000 Å.

12. The method as claimed in claim 1, wherein said organic material layer and said conductive layer thereon are removed by the liquid selected from the group consisting of water and acid solution.

13. A method of manufacturing a film antenna, comprising the steps of:
   providing a substrate;
   patterning an organic material layer on said substrate;
   drying said substrate and said organic material layer;
   forming a conductive layer on said substrate and said organic material layer; and
   forming a protective layer on said conductive layer; and
   removing said organic material layer and said layers thereon.

14. The method as claimed in claim 13, wherein said substrate is the material selected from the group consisting of polyimide, polyethylene terephthalate, polycarbonate, polymethyl methacrylate, glass, and acrylic resin.

15. The method as claimed in claim 13, wherein said organic material layer is patterned by a screen printing technique.

16. The method as claimed in claim 13, wherein said organic material layer is patterned by a spray coating technique.

17. The method as claimed in claim 13, wherein said organic material layer is the material selected from the group consisting of heat-dry ink, water soluble resin, water soluble lactoprene, and water soluble polyvinyl alcohol.

18. The method as claimed in claim 13, wherein said substrate and said organic material layer are dried by heating.

19. The method as claimed in claim 13, wherein said substrate and said organic material layer are dried by ultraviolet radiation.

20. The method as claimed in claim 13, wherein said conductive layer is formed by an evaporation coating technique.

21. The method as claimed in claim 13, wherein said conductive layer is the material selected from the group consisting of copper, nickel copper alloy, and silver.

22. The method as claimed in claim 13, wherein said conductive layer has a thickness in the range between 2000–5000 Å.

23. The method as claimed in claim 13, wherein said conductive layer and said protective layer are formed by a sputtering technique.

24. The method as claimed in claim 13, wherein said organic material layer and said layers thereon are removed by the liquid selected from the group consisting of water and acid solution.

* * * * *